United States Patent
Yokoi et al.

(10) Patent No.: US 10,617,049 B2
(45) Date of Patent: Apr. 7, 2020

(54) COMPONENT MOUNTING DEVICE AND GRIPPING MEMBERS

(71) Applicant: FUJI MACHINE MFG. CO., LTD., Chiryu (JP)

(72) Inventors: Yuta Yokoi, Kariya (JP); Yusuke Tsuchiya, Toyota (JP)

(73) Assignee: FUJI CORPORATION, Chiryu (JP)

( * ) Notice: Subject to any disclaimer, the term of this patent is extended or adjusted under 35 U.S.C. 154(b) by 729 days.

(21) Appl. No.: 15/110,639

(22) PCT Filed: Jan. 17, 2014

(86) PCT No.: PCT/JP2014/050828
§ 371 (c)(1),
(2) Date: Jul. 8, 2016

(87) PCT Pub. No.: WO2015/107680
PCT Pub. Date: Jul. 23, 2018

(65) Prior Publication Data
US 2016/0330881 A1 Nov. 10, 2016

(51) Int. Cl.
*H05K 13/04* (2006.01)

(52) U.S. Cl.
CPC ..... *H05K 13/0404* (2013.01); *H05K 13/0408* (2013.01)

(58) Field of Classification Search
CPC .................. H05K 13/0404; H05K 13/0408
See application file for complete search history.

(56) References Cited

U.S. PATENT DOCUMENTS

| | | | | |
|---|---|---|---|---|
| 5,010,474 A | * | 4/1991 | Tsuruta | H05K 13/0408 700/57 |
| 5,842,272 A | * | 12/1998 | Nuxoll | H05K 13/021 29/739 |
| 6,209,194 B1 | * | 4/2001 | Kang | G01R 31/2851 198/438 |
| 6,870,745 B2 | * | 3/2005 | Suhara | H05K 13/0069 29/740 |

(Continued)

FOREIGN PATENT DOCUMENTS

CN 1838870 A 9/2006
JP 2003-25266 A 1/2003

OTHER PUBLICATIONS

International Search Report dated Mar. 4, 2014, in PCT/JP2014/050828 filed Jan. 17, 2014.

(Continued)

*Primary Examiner* — Minh N Trinh
(74) *Attorney, Agent, or Firm* — Oblon, McClelland, Maier & Neustadt, L.L.P.

(57) ABSTRACT

A mounting device is provided with a mechanical chuck that picks up a component housed in a tray by gripping the component in a state with a cam follower contacting tray housing the component at a predetermined height. The mechanical chuck is provided with a first holding member including a first gripping member, and a second holding member including a second gripping member. The cam follower is a rotatable roller, and when the first holding member moves when picking up the component from tray, the cam follower rotates according to this movement in a state contacting tray.

9 Claims, 7 Drawing Sheets

(56) References Cited

U.S. PATENT DOCUMENTS

| | | | |
|---|---|---|---|
| 7,313,860 B2* | 1/2008 | Takahashi | H05K 13/0406 29/740 |
| 7,350,289 B2* | 4/2008 | Narita | H05K 13/0413 29/743 |
| 2003/0014860 A1 | 1/2003 | Isogai et al. | |
| 2003/0014862 A1* | 1/2003 | Suhara | H05K 13/041 29/832 |
| 2005/0105351 A1 | 5/2005 | Kojima | |
| 2006/0225270 A1 | 10/2006 | Wong et al. | |
| 2010/0064510 A1* | 3/2010 | Narita | H01L 21/67132 29/739 |
| 2016/0330881 A1* | 11/2016 | Yokoi | H05K 13/0408 |

OTHER PUBLICATIONS

Combined Office Action and Search Report dated Jun. 12, 2018 in Chinese Patent Application No. 201480072946.7 (with English translation of Office Action and English translation of categories of cited documents), citing document AO therein, 16 pages.

Extended European Search Report dated Nov. 11, 2016 in Patent Application No. 14879128.8.

* cited by examiner

COMPONENT MOUNTING DEVICE AND GRIPPING MEMBERS

TECHNICAL FIELD

The present disclosure relates to a mounting device and a holding member.

Background Art

Conventionally, as a mounting device, there is an item that is provided with at least one pair a movable members (holding claws) which are capable of moving towards each other, and that performs control such that the holding claws are moved based on a position command that exceeds an actual holding position, the moving claws are stopped after the claws contact an electronic component at a point when a suitable gripping force is achieved, the position is set as a new target position, and the holding claws are maintained at that target position (for example, patent literature 1). With this device, a specified gripping force can be achieved even in cases where there are dimensional differences between electronic components, meaning that electronic components can be held stably.

CITATION LIST

Patent Literature

Patent Literature 1: JP-A-2003-25266

SUMMARY

Technical Problem

However, for example, when picking up components which are tall and the like, there are cases in which a mechanical chuck that grips the component with gripping claws is used. In this case, for example, if the height position of gripped components is not stable, there may be problems positioning the component at a mounting position. Also, for example, when judging whether the pickup state of a component is suitable by imaging held components, if there is height variance in the held components, that pickup state judgment may not be correct. Further, when performing positioning of components in the component height direction by directly contacting the component, there is the problem that damage or deformation of the component may occur. This means there is a demand to make the pickup position of a component in the height direction suitable.

The present disclosure takes account of such problems and an object thereof is to provide a mounting device and holding device capable of gripping a component at a more stable gripping position in the height direction.

Solution to Problem

The present disclosure is a mounting device that performs mounting processing of mounting a component at a predetermined mounting position on a board, and comprises a head unit including a contacting section that contacts at a predetermined height position a housing section housing a component, and a gripping section that picks up a component housed in the housing section by gripping the component in a state with the contacting section and the housing section contacting each other.

With this mounting device, a component housed in a housing section is picked up by being gripped in a state in which the contacting section is contacting the housing section housing the component at a predetermined height position. Because the contacting section and the housing section are contacting each other, the component is positioned stably at a height based on the predetermined height. Accordingly, the component is gripped at a gripping position which is more stable in the height direction. Also, compared to an item that performs positioning of the component in the height direction by contacting the component with a member, effects on the component such as damage and deformation are curtailed. Further, in a state with a gripping member gripping a component, compared to pickup using a suction nozzle for example, position deviation of components in the height direction may occur, meaning a there is a strong need to use the present disclosure. With the present disclosure, a component housed in the housing section may be picked up with the contacting section and the housing section in a state pushed against each other, and a component housed in the housing section may be picked up with the housing section being pressed by the contacting section. Further, the "predetermined height position" may be any position so long as the position is such that the relative positional relationship between the contacting section and the component in the height direction is decided.

With the mounting device of the present disclosure, the contacting section may include a cam follower that rotates according to the movement of the gripping section when the gripping section moves when picking up the component, in a state contacting the housing section. Thus, by the contacting section and the housing section being in a contacting state due to the cam follower; movement of the gripping section is smooth, and it is easy to grip the component at a more stable gripping position in the height direction.

With the mounting device of the present device, the head unit may include a holding member on which the gripping section is provided, and a head holding body on which the holding member is mounted, and the contacting section may be provided on the holding member. Thus, it is possible to mount a holding member to match the type of component, making it possible to grip various components at a more stable gripping position in the height direction.

With the mounting device of the present device, the head unit may include a holding member on which the gripping section is provided, and a head holding body on which the holding member is mounted, and the contacting section may be provided on the head holding body.

With the mounting device of the present disclosure, the contacting section may contact the housing section at at least two locations. Thus, it is possible to grip a component more reliably at a gripping position which is more stable in the height direction.

With the mounting device of the present disclosure, the head unit may be provided with a height adjusting mechanism capable of changing the height of the contacting section to the predetermined height position. Thus, because the predetermined height position can be set based on various components with different sizes in the height direction, as well as gripping various components, it is possible to achieve a more stable gripping position in the height direction.

The mounting device of the present disclosure may be further provided with a control means that moves the gripping section so as to grip the component housed in the housing section in a state with the contacting section contacting the housing section.

The present disclosure of a holding member may be a holding member mounted on a head unit of a mounting device that performs mounting processing of mounting a component at a predetermined mounting position on a board, with the holding member including a contacting section that contacts at a predetermined height position a housing section housing a component, and a gripping section that picks up a component housed in the housing section by gripping the component in a state with the contacting section and the housing section contacting each other. Because with this holding member, in a similar manner to the above mounting device, the contacting section and the housing section are contacting each other, the component is positioned stably at a height based on the predetermined height, and the component is gripped at a gripping position more stable in the height direction. Note that, for the holding section, various forms of the above mounting device may be used, and configurations to realize various functions on the above mounting device may be added.

DETAILED DESCRIPTION

Figure 1:
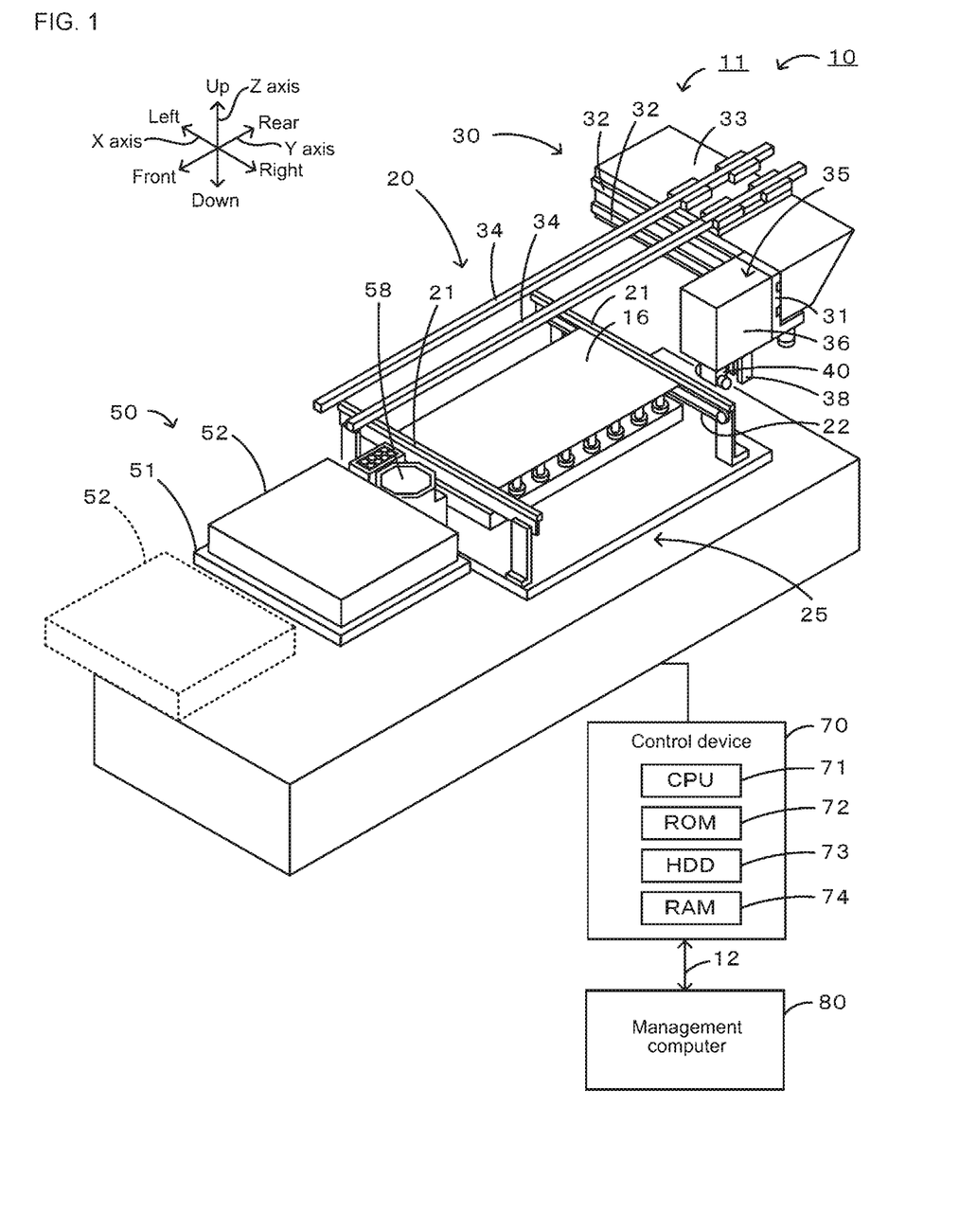
FIG. 1 shows the overall configuration of component mounting system 10.
Figure 2:
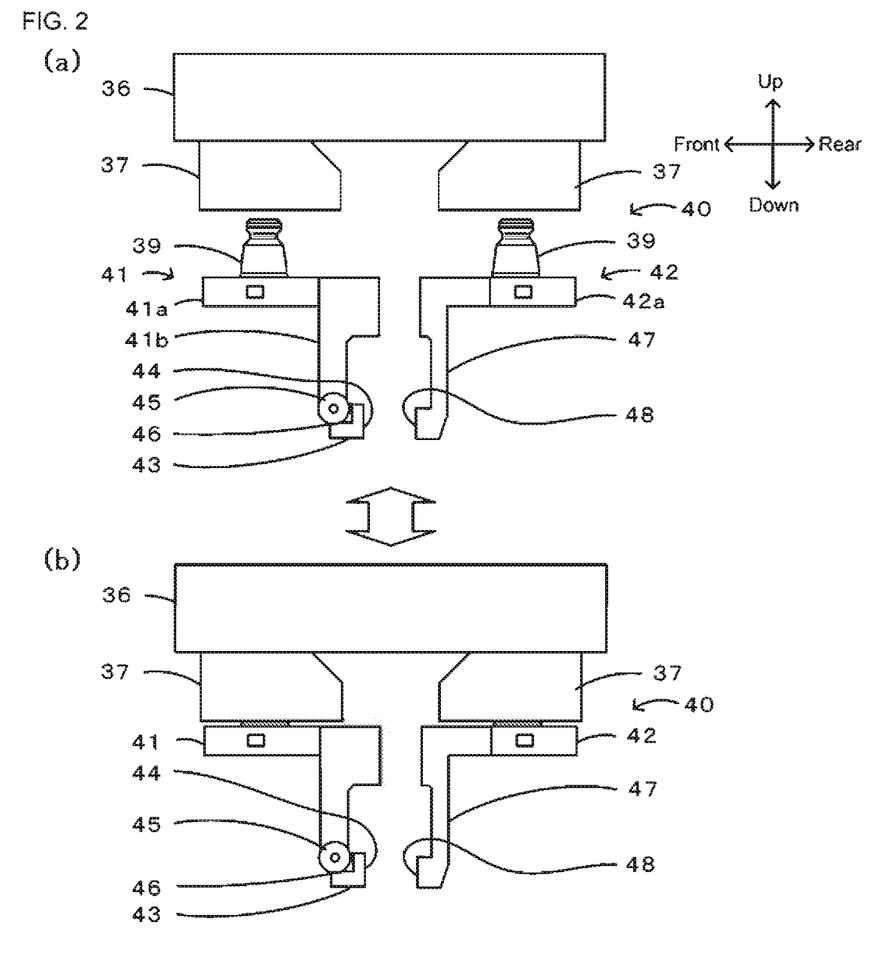
FIGS. 2A and 2B show the overall configuration of mechanical chuck 40.
Figure 3:
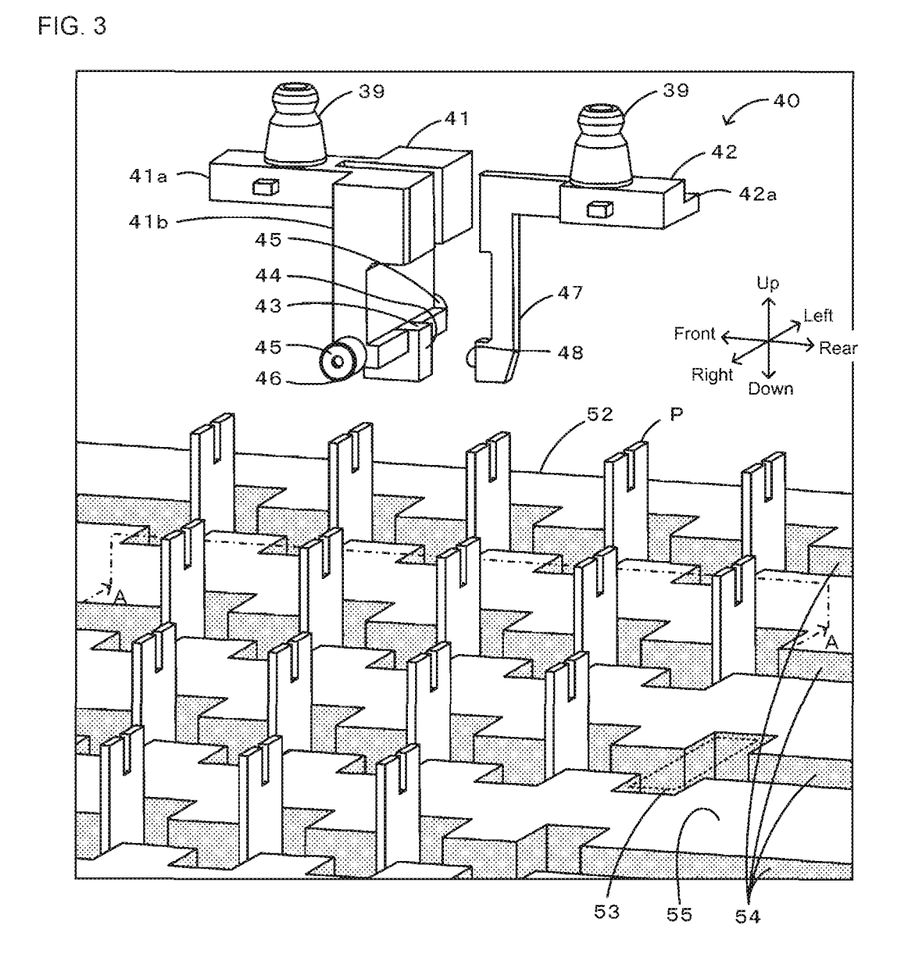
FIG. 3 shows mechanical chuck 40 and tray 52.
Figure 4:
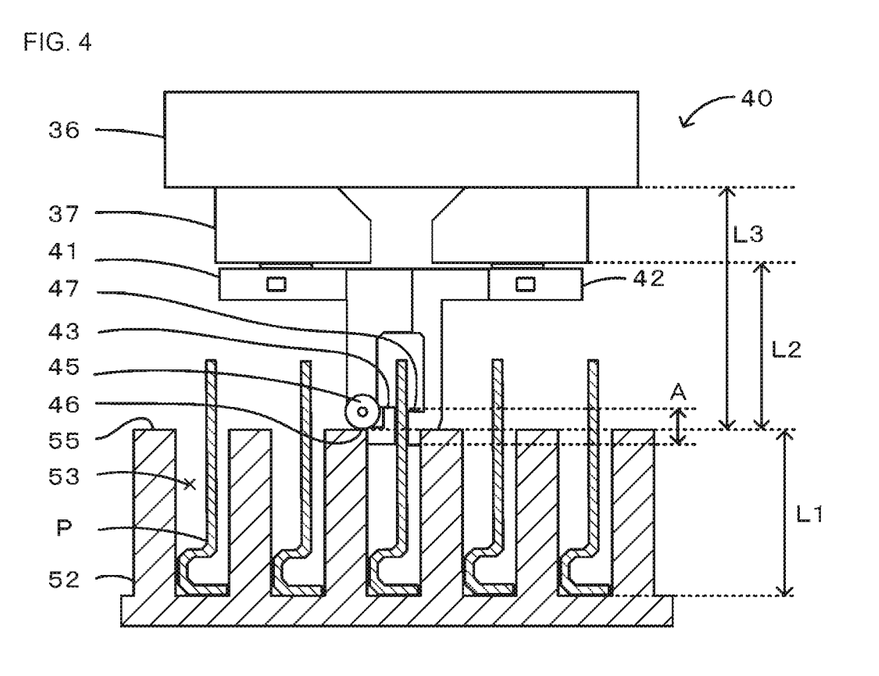
FIG. 4 shows the positional relationship between mechanical chuck 40 and components P of tray 52.
Figure 5:
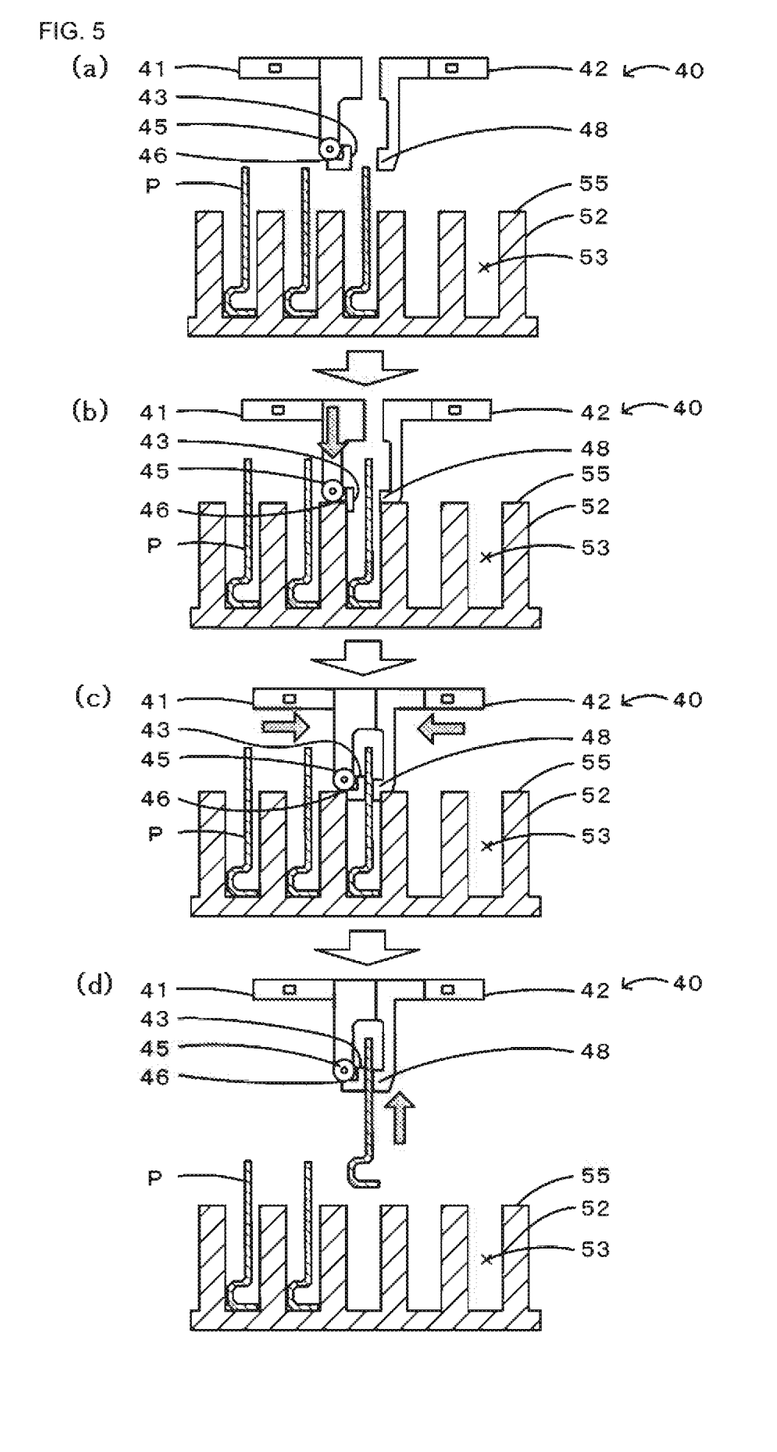
FIGS. 5A, 5B, 5C, and 5D show operation of mechanical chuck 40 when gripping component P.

Hereinafter, an embodiment of the present disclosure will be described with reference to the figures. FIG. 1 shows the overall configuration of component mounting system 10. FIGS. 2A and 2B show the overall configuration of mechanical chuck 40; FIG. 2A shows the state before being mounted in head holding body 36; FIG. 2B shows the state after being mounted in head holding body 36. FIG. 3 shows mechanical chuck 40 and tray 52. FIG. 4 shows the positional relationship between mechanical chuck 40 and components P of tray 52. Tray 52 of FIGS. 4 and 5 shows cross section A-A of FIG. 3. In the present embodiment, left-right directions (X axis), front-rear directions (Y axis), and up-down directions (Z axis) are set as shown in FIGS. 1 to 3. Mounting processing includes processing such as arranging a component above a board, mounting, insertion, joining, and gluing.

Component mounting system 10 is provided with mounting device 11 that is connected to LAN 12 and configured as a mounting line, and management computer 80 that is connected to LAN 12 and manages information of components to be mounted and so on. Multiple mounting devices 11 that each perform mounting processing of mounting an electronic component (referred to as "component P") onto board 16 are arranged from an upstream side to a downstream side (left to right in FIG. 1) in component mounting system 10. Note that FIG. 1 only shows one mounting device 11.

Mounting device 11 is provided with board conveyance unit 20 that conveys board 16, board supporting unit 25 that supports board 16 from below, and head moving unit 30 including head unit 35 that picks up component P by gripping it and moving above board 16. Further, component mounting device 11 is provided with supply unit 50 including tray 52 that houses components P, part camera 58 that images component P gripped by head unit 35 from below, side camera 38 that images component P gripped by head unit 35 from the side, and control device 70 that performs various controls.

Board conveyance unit 20 conveys board 16 from left to right using conveyor belts 22 and 22 (only one of these is shown in FIG. 1) that are respectively attached to a pair of front/rear supporting plates 21 and 21. Board supporting unit 25 is provided with a backup plate removably attached to a base plate, and multiple support pins provided on the backup plate that support board 16 from below. This board supporting unit 25 supports from below board 16 that is conveyed and fixed by board conveyance unit 20.

Head moving unit 30 is provided with X-axis slider 31, guide rails 32, Y-axis slider 33, and guide rails 34, and the like X-axis slider 31 is attached to the front surface of Y-axis slider 33, which is slidable in the front/rear direction, so as to be slidable in the left/right direction. Y-axis slider 33 is slidably attached to a pair of guide rails 34 that extend in the front/rear direction. Guide rails 32 that extend in the left/right direction are provided on the front surface of Y-axis slider 33, and X-axis slider 31 is attached to these guide rails 32 so as to be slidable in the left/right direction. Head unit 35 is attached to X-axis slider 31 and moves in a left/right direction with the left/right direction movement of X-axis slider 31 along guide rails 32 and 32, and moves in a front/rear direction with the front/rear movement of Y-axis slider 33 along guide rails 34 and 34. This allows head unit 35 to move in an XY plane. Sliders 31 and 33 are each driven by a servo motor that is not shown in the figures.

Head unit 35 picks up components and moves above board 16, and is attached to the front surface of X-axis slider 31. Head unit 35 is provided with head holding body 36 arranged on X-axis slider 31, and mechanical chuck 40 held by head holding body 36 that picks up component P from tray 52 by gripping component P. As shown in FIGS. 2A and 2B, provided on the lower surface of head holding body 36 are a pair of supporting moving sections 37 and 37 that are moved towards/away from each other in the front/rear direction by a drive section, which is not shown. A mounting section, which is not shown, is formed on the lower surface of supporting moving sections 37, and mechanical chuck 40 is held by joint 39 of mechanical chuck 40 being inserted into and fixed in these mounting sections (FIG. 2B). Further, side camera 38 that images component P gripped by mechanical chuck 40 from the side is fixed on head unit 35 (see FIG. 1). Control device 70 obtains the deviation in the height direction (up/down direction) of picked up component P by analyzing the image captured by side camera 38.

As shown in FIGS. 2 to 4, mechanical chuck 40 is provided with first holding member 41 and second holding member 42, and is configured as a holding tool that picks up component P by gripping an upper end of component P at a predetermined position. First holding member 41 is provided with base section 41a the upper surface on which joint 39 that connects to head holding body 36 is arranged, and support plate 41b formed in a direction straight down from base section 41a. With mechanical chuck 40, first gripping member 43 on which gripping surface 44 that contacts component P is formed, is provided on the lower end of support plate 41b. With first holding member 41, a pair of cam followers 45 are formed on both sides of first gripping member 43, and the pair of cam followers 45 contact upper surface 55 of tray 52 housing components P at a predetermined height position. Cam followers 45 are rotatable rollers, and when first holding member 41 moves when picking up component P from tray 52, cam followers 45 rotate according to this movement in a state contacting tray 52. Contacting point 46 that contacts upper surface 55 of tray 52 is the lower surface of cam follower 45. Second holding member 42 is provided with base section 42a the upper surface on which joint 39 that connects to head holding body 36 is arranged, and second gripping member 47 formed in a direction straight down from base section 42a; gripping surface 48 that contacts component P is formed on the lower front surface of second gripping member 47. Mechanical chuck 40 picks up component P housed in tray 52 by gripping component P with contacting point 46 of cam follower 45 contacting tray 52 by first gripping member 43 of first holding member 41 and second gripping member 47 of second holding member 42 approaching each other. Mechanical chuck 40 is raised/lowered in the Z-axis direction (up/down direction), which is perpendicular to the X-axis and Y-axis directions, by a raising/lowering device that has a Z-axis motor, which is not shown, as a drive source. Also, mechanical chuck 40 is rotatable in the Z-axis direction by a rotation mechanism, which is not shown. When mechanical chuck 40 grips component P above tray 52, and when mechanical chuck 40 arranges component P on board 16, positioning is performed in the rotation direction at a predetermined position. For example, mechanical chuck 40, when gripping component P above tray 52, rotates and positions such that groove 54 and first and second gripping members 43 and 47 are parallel.

Supply unit 50 is provided with a magazine cassette, which is not shown, that houses multiple trays 52 housing multiple components P, pallet 51 to which a desired tray 52 is fixed, and a tray moving section, which is not shown, that moves pallet 51 to which tray 52 is fixed between a predetermined initial position and a pickup position. Tray 52 is formed from plastic with a roughly rectangular external shape, and as shown in FIG. 3, housing cavities 53 for housing components P and grooves 54 that connect housing cavities 53 in the front/rear direction are formed in tray 52. Housing cavities 53 are multiple rectangular cuboid cavities arranged in the front/rear and left/right directions; grooves 54 are cavities for first gripping member 43 and second gripping member 47 to enter when mechanical chuck 40 grips component P. Tray 52; when being used for mounting processing, is fixed to pallet 51 with, for example, a metal fixture, a magnet, or the like. The pallet 51 is pulled forward from the magazine pallet, and when arranged at a predetermined position, components housed in tray 52 are able to be picked up by head unit 35. Component P includes a curved section curved at the lower of the component, and is a tall component. Component P, for example, may be a component to be arranged on another component already arranged on board 16.

The positional relationship between mechanical chuck 40 and tray 52 is described below with reference to FIG. 4. Cam follower 45, contacting point 46 of which contacts tray 52 housing components P at a predetermined height position, is provided on mechanical chuck 40. With mechanical chuck 40, when contacting point 46 of cam follower 45 is contacting upper surface 55 of tray 52, the relative positional relationship of component P and gripping region A of mechanical chuck 40 when gripping component P is decided. In other words, the gripping position of component P in the height direction is decided stably. Note that, so long as the predetermined height position is based on a decided relative positional relationship between component P and gripping region A of mechanical chuck 40 when gripping component P, the reference position which is the reference for that height position, and the height position itself are not particularly limited. For example, if the reference position is the surface on which component P is loaded, height L1 can be used; if the reference position is the lower surface of supporting moving section 37, height L2 can be used; and if the reference position is the lower surface of head holding body 36, height L3 can be used. Note that, cam follower 45 was described as an item that contacts upper surface 55 of tray 52; however, this is not limited to surface 55, so long as tray 52 is contacted and the relative positional relationship between component P and gripping region A is decided.

As shown in FIG. 1, control device 70 is configured from a microprocessor based around CPU 71, ROM 72 that memorizes a processing program, HDD 73 that memorizes various data, RAM 74 used as working memory, an input/output interface for performing communication of electric signals with external devices, and so on, and these are connected by a bus. Control device 70 is electrically connected to board conveyance unit 20, board supporting unit 25, head moving unit 30, head unit 35, supply unit 50, part camera 58, and side camera 38, and performs input/output of signals with these items. Control device 70 performs control such that mechanical chuck 40 grips component P housed in tray 52 with cam follower 45 contacting tray 52.

Management computer 80 manages information of multiple mounting devices 11, and is provided with an HDD on which is memorized production condition information and so on used in the mounting processing of mounting device 11.

Next, operation of component mounting system 10 of the present embodiment as configured above is described, in particular operation of the mounting processing of mounting device 11. FIGS. 5A-5D show operation of mechanical chuck 40 when gripping component P; FIG. 5A shows a state before gripping component P; FIG. 5B shows a state with tray 52 contacted; FIG. 5C shows a state with component P gripped; and FIG. 5D shows a state with component P picked up. When a command to start mounting of components on board 16 is received, control device 70 of mounting device 11 fixes tray 52 housing the components to be mounted on pallet 51, and moves pallet 51 to the pickup position. Next, control device 70 controls X-axis slider 31 and Y-axis slider 33 such that mechanical chuck 40 is directly above component P (FIG. 5A). Then, control device 70 lowers mechanical chuck 40 such that contacting point 46 of cam follower 45 contacts upper surface 55 of tray 52 (FIG. 5B). At this time, the predetermined position of component P is able to be gripped by first gripping member 43 and second gripping member 47. Continuing, control device 70 moves the pair of supporting moving sections 37 (refer to FIGS. 2A and 2B) towards each other other, contacts component P with gripping surface 44 of first gripping member 43 and gripping surface 48 of second gripping member 47 so as to grip component P (FIG. 5C). Continuing, control device 70 raises mechanical chuck 40 and obtains the deviation in the height direction of component P gripped by mechanical chuck 40 by imaging component P using side camera 38. For example, there are cases in which, based on the deviation of component P in the height direction, the imaging region of side camera 38 must be changed. Here, because component P is gripped at a more stable position, component P can be imaged more reliably by side camera 38, and correction of deviation in the height direction can be performed more reliably. Subsequently, control device 70 controls sliders 31 and 33 such that component P gripped by mechanical chuck 40 comes directly above a predetermined position on board 16, and arranges component P at a position after correcting for the gripping position deviation of component P.

Correspondences between constituent elements of the present embodiment and constituent elements of the disclosure will be clarified here. Tray 52 of the present embodiment corresponds to the housing section, cam follower 45 corresponds to the contacting section, first gripping member 43 and second gripping member 47 correspond to the gripping section, first holding member 41 and second holding member 42 correspond to the holding member, control device 70 corresponds to the control means, and head holding body 36 corresponds to the head holding body.

Mounting device 11 described above is provided with mechanical chuck 40 that picks up component P housed in tray 52 by gripping component P in a state with cam follower 45 contacting tray 52 housing component P at a predetermined height. In this way, with mechanical chuck 40, because cam follower 45 and tray 52 are contacting each other, component P is positioned stably at a height based on the predetermined height. Accordingly, with mechanical chuck 40, component P is gripped at a gripping position which is more stable in the height direction. Also, with mechanical chuck 40, compared to an item that performs positioning of component P in the height direction by contacting component P with a member, effects on component P such as damage and deformation are curtailed. Further, in a state with first and second gripping members 43 and 47 gripping a component, compared to pickup using a suction nozzle for example, position deviation of components in the height direction may occur, meaning a there is a strong need to use the present disclosure.

Also, with mechanical chuck 40, because tray 52 is contacted by cam follower 45, movement of first gripping member 43 and second gripping member 47 is smooth, and it is easy to grip the component at a more stable gripping position in the height direction. Further, with mechanical chuck 40, because cam follower 45 is provided on first holding member 41, it is possible to change mechanical chuck 40 based on the type of component, making it possible to grip various components at a more stable gripping position in the height direction. Further, with mechanical chuck 40, because tray 52 is contacted at two locations by a pair of cam followers 45, it is possible to grip component P at a gripping position which is more stable in the height direction.

Meanwhile, it goes without saying that the disclosure is not limited to the above-mentioned embodiment and various embodiments may be applied within the technical scope of the disclosure. For the alternative embodiment described below, the same reference symbols are used and descriptions are abbreviated or omitted for configuration items similar to the above embodiment.

Figure 6:
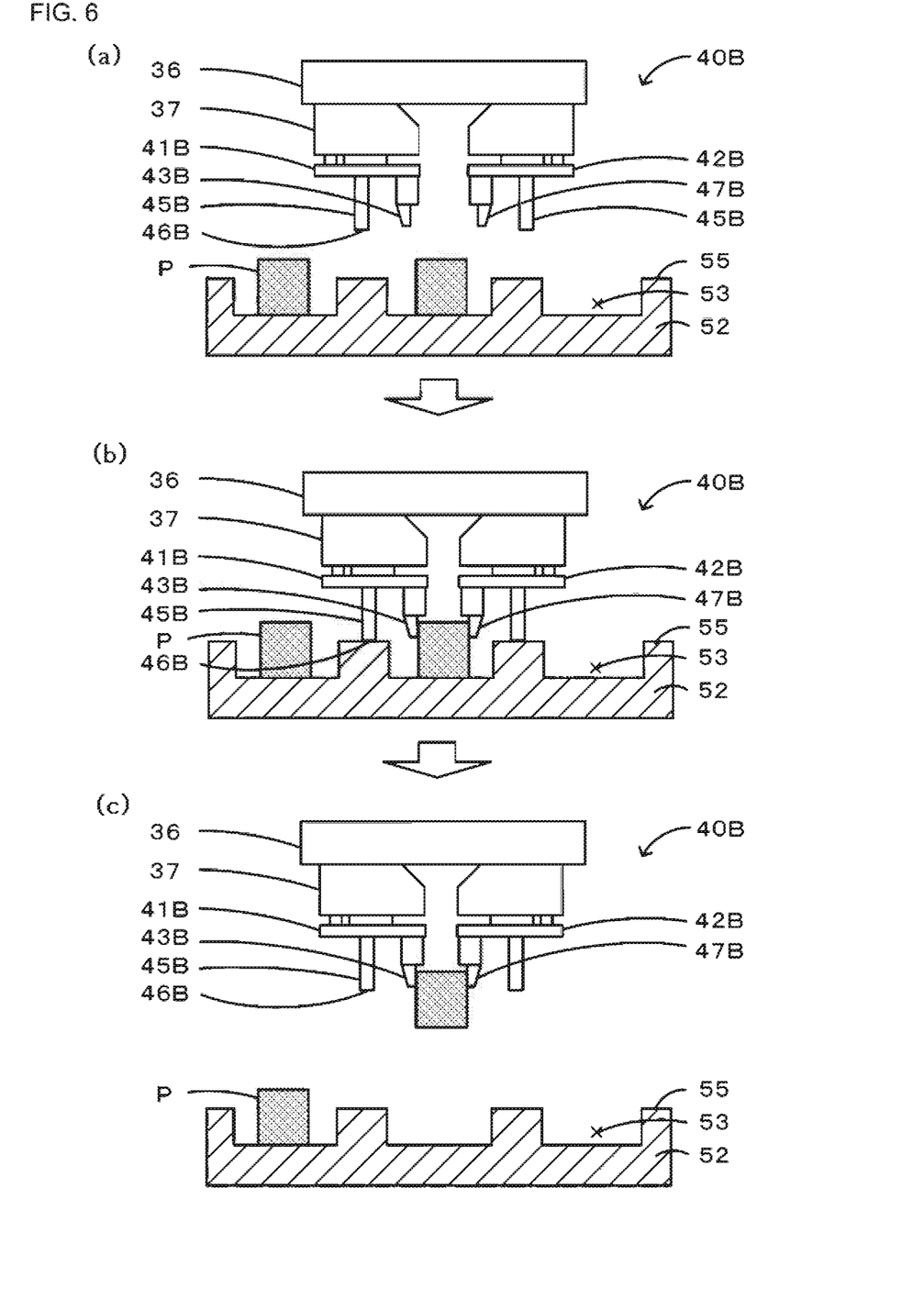
FIGS. 6A, 6B, and 6C show a different mechanical chuck, mechanical chuck 40B.

For example, in the above embodiment, cam follower 45, which is rotatable, is provided as the contacting section, but this is not limited to a rotatable item, so long as it contacts tray 52. FIGS. 6A-6C show operation of mechanical chuck 40B, which is a different mechanical chuck; FIG. 6A showing a state before gripping component P; FIG. 6B shows a state with tray 52 contacted and component P gripped; and FIG. 6C shows a state with component P picked up. Mechanical chuck 40B is provided with first holding member 41B and second holding member 42B, and is configured as a holding tool that picks up component P by gripping an upper end of component P at a predetermined position. First holding member 41B is provided with supporting plate formed directly down from the base section, and first gripping claw 43B, on which a gripping surface that contacts component P is formed, is provided on the lower end of the support plate. Pillar-shaped contacting member 45B that contacts upper surface 55 of tray 52 housing components P at a predetermined height position is formed on first holding member 41B close to first gripping claw 43B. Contacting point 46B that contacts upper surface 55 of tray 52 is the bottom surface of this contacting member 45B. So long as this contacting member 45B contacts tray 52 at the predetermined height position, it may be pillar-shaped, rod-shaped, or wall-shaped. Second holding member 42B has the same configuration as first holding member 41B and is provided with contacting member 45B and second gripping claw 47B. Also, during mounting processing, control section 70 moves mechanical chuck 40 directly above component P (FIG. 6A). Next, control device 70 lowers mechanical chuck 40B such that contacting point 46B of contacting member 45B contacts upper surface 55 of tray 52, moves the pair of supporting moving sections 37 towards each other, such that component P is gripped by the gripping surface of first gripping claw 43B and the gripping surface of second gripping claw 47B contact component P (FIG. 6B). Then, control device 70 raises mechanical chuck 40B to pick up component P from housing cavity 53 of tray 52. In this way, with mechanical chuck 40B too, because contacting member 45B and tray 52 are contacting each other, component P is positioned stably at a height based on the predetermined height, and component P is gripped at a gripping position more stable in the height direction.

Also, with the above embodiment, cam follower 45 was described as the contacting section; however, for example, the mechanical chuck may be provided with cam follower 45 and contacting member 45B as a contacting section. With the above embodiment, cam follower 45 is provided on first holding member 41, and the contacting section is not provided on second holding member 42; however, cam follower 45 and contacting member 45B may be provided on second holding member 42 as well. Thus, it is possible to grip component P more reliably at a gripping position which is more stable in the height direction.

With the above embodiment, cam follower 45 as a contacting section is made to contact tray 52; however, for example, the contacting section and tray 52 may be pushed against each other, or tray 52 may be pressed more strongly with the contacting section. This allows the position deviation in the height direction to be curtailed even more.

Figure 7:
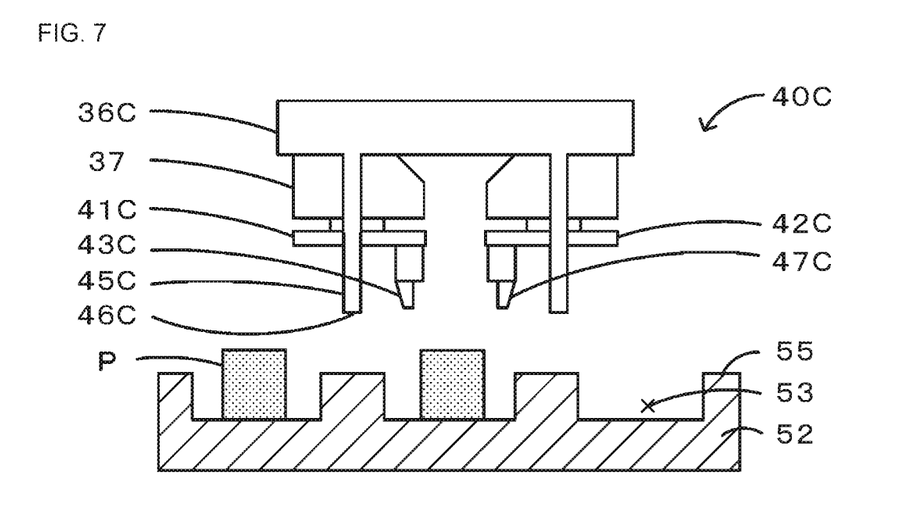
FIG. 7 shows a different mechanical chuck, mechanical chuck 40C.

With the above embodiment, head unit 35 includes mechanical chuck 40 provided with first holding member 41 that includes first gripping member 43, and second holding member 42 that includes second gripping member 47, and head holding body 36 on which mechanical chuck 40 is mounted; further, cam follower 45 is provided on mechanical chuck 40 as the contacting section; however, the disclosure is not restricted to this, for example, the contacting section may be provided on head holding body 36. FIG. 7 shows a different mechanical chuck, mechanical chuck 40C. Mechanical chuck 40C is provided with first holding member 41C and second holding member 42C. First holding member 41C is provided with first gripping claw 43C, which is similar to first holding member 41B. Second holding member 42C has a similar configuration to first holding member 41C and is provided with second gripping claw 47C. Pillar-shaped contacting member 45C that contacts upper surface 55 of tray 52 housing components P at a predetermined height position is provided on head holding body 36C. Contacting point 46C that contacts upper surface 55 of tray 52 is the bottom surface of this contacting member 45C. In this way, with mechanical chuck 40C too, because contacting member 45C and tray 52 are contacting each other, component P is positioned stably at a height based on the predetermined height, and component P is gripped at a gripping position more stable in the height direction.

With the above embodiment, mechanical chuck 40 is provided with two cam followers 45 as contacting sections such that tray 52 is contacted at two locations; however, the disclosure is not restricted to this, and the contacting section may contact tray 52 at one location, or the contacting section may contact tray 52 at three or more locations. Contacting tray 52 at two or more locations with the contacting section is desirable because this makes position deviation in the height direction less likely.

With the above embodiment, description was given of a fixed positional relationship between cam follower 45 as the contacting section and first gripping member 43; however, the disclosure is not restricted to this, and a height adjusting mechanism to allow changes of the height of the contacting section may be provided. Thus, because the predetermined height position can be set based on various components with different sizes in the height direction, as well as gripping various components, it is possible to achieve a more stable gripping position in the height direction. Also, with mounting device 11 it is desirable that it is not necessary to provide a mechanical chuck 40 to suit each component.

In the above embodiment, mounting device 11 was described as an embodiment, but the disclosure is not restricted to this and may take the form of mechanical chuck 40.

INDUSTRIAL APPLICABILITY

The present disclosure may be applied to the industrial field of electronic component mounting.

REFERENCE SIGNS LIST

10: component mounting system; 11: mounting device; 12: LAN; 16: board; 20: board conveyance unit; 21: supporting plate; 22: conveyor belt; 25: board supporting unit; 30: head moving unit; 31: X-axis slider; 32: guide rail; 33: Y-axis slider; 34: guide rail; 35: head unit; 36: head holding body; 37: supporting moving section; 38: side camera; 39: joint; 40, 40B, 40C: mechanical chuck; 41, 41B, 41C: first holding member; 41a: base section; 41b: support plate; 42, 42B, 42C: second holding member; 43: first gripping member; 43B, 43C: first gripping claw; 44: gripping surface; 45: cam follower; 45B, 45C: contacting member; 46, 46B, 46C: contacting point; 47: second gripping member; 47B. 47C: second gripping claw; 48: gripping surface; 50: supply unit; 51: pallet; 52: tray; 53: housing cavity; 54: groove; 55: upper surface; 58: part camera; 70: control device; 71: CPU; 72: ROM; 73: HDD; 74: RAM; 80: management computer; A: gripping region; P: component

The invention claimed is:

1. A mounting device that performs mounting processing of mounting a component at a predetermined mounting position on a board, the mounting device comprising:
a head unit including
a contacting section that contacts, at a predetermined height position, a top surface of a housing section housing the component, and a top surface of the component being above the top surface of the housing section when the component is housed in the housing section, the contacting section including a cam follower or a pillar-shaped contacting member including a contacting point which contacts the top surface of the housing section,
first and second gripping members which pick up the component housed in the housing section by gripping the component when the contacting section and the top surface of the housing section are contacting each other, the first gripping member having a first gripping surface and the second gripping member having a second gripping surface, the first gripping surface and second gripping surface facing each other, the first gripping surface abutting a first surface of the component and the second gripping surface abutting a second surface of the component at a vertical position between the top surface of the housing section and the top surface of the component when the first and second gripping members pick up the component,
first and second holding members which respectively hold the first and second gripping members, and
a head holding body which holds the first and second holding members,
wherein the contacting section is provided on one of the first and second holding members or on the head holding body.

2. The mounting device according to claim 1, wherein the contacting section includes the cam follower that rotates according to movement of the first and second gripping members when the first and second gripping members move when picking up the component, in a state contacting the top surface of the housing section.

3. The mounting device according to claim 1, wherein the contacting section is provided on the first holding member.

4. The mounting device according to claim 1, wherein the contacting section is the pillar-shaped contacting member provided on the head holding body.

5. The mounting device according to claim 1, wherein the contacting section contacts the top surface of the housing section at at least two locations.

6. The mounting device according to claim 1, wherein the head unit is provided with a height adjusting mechanism that changes the predetermined height position of the contacting section.

7. The mounting device according to claim 1, further comprising:
a control device that moves the first and second gripping members so as to grip the component housed in the housing section in a state with the contacting section contacting the top surface of the housing section.

8. The mounting device according to claim 1, wherein the first gripping member and the second gripping member are movable relative to each other.

9. A mounting device that performs mounting processing of mounting a component at a predetermined mounting position on a board, the mounting device comprising:
a head unit including
a contacting section that contacts, at a predetermined height position, a top surface of a tray housing multiple components, the contacting section including a cam follower or a pillar-shaped contacting member including a contacting point which contacts the top surface of the tray,
first and second gripping members that pick up the component housed in the tray by gripping the component when the contacting section and the top surface of the tray are contacting each other, first and second holding members which respectively hold the first and second gripping members, and a head holding body which holds the first and second holding members, wherein the contacting section is provided on one of the first and second holding members or on the head holding body.

* * * * *

UNITED STATES PATENT AND TRADEMARK OFFICE
CERTIFICATE OF CORRECTION

| | |
|---|---|
| PATENT NO. | : 10,617,049 B2 |
| APPLICATION NO. | : 15/110639 |
| DATED | : April 7, 2020 |
| INVENTOR(S) | : Yuta Yokoi et al. |

It is certified that error appears in the above-identified patent and that said Letters Patent is hereby corrected as shown below:

On the Title Page

Item (71), the Applicant name is incorrect. Item (71) should read:
--(71) Applicant: FUJI CORPORATION, Chiryu (JP)--

Item (87), the PCT Pub Date is incorrect. Item (87) should read:
--(87) PCT Pub. No.: WO 2015/107680
PCT Pub Date: Jul. 23, 2015--

Signed and Sealed this
Sixteenth Day of June, 2020

Andrei Iancu
*Director of the United States Patent and Trademark Office*